United States Patent [19]

Plichta

[11] Patent Number: 4,482,858

[45] Date of Patent: Nov. 13, 1984

[54] APPARATUS FOR AND A METHOD OF TESTING DETONATING SYSTEMS

[75] Inventor: Bohumil M. J. Plichta, Kempton Park, South Africa

[73] Assignee: AECI Limited, Johannesburg, South Africa

[21] Appl. No.: 359,893

[22] Filed: Mar. 19, 1982

[30] Foreign Application Priority Data

Mar. 27, 1981 [ZA] South Africa ............... 81/2074

[51] Int. Cl.³ ........................................... G01R 27/00
[52] U.S. Cl. .................................. 324/57 Q; 361/251; 324/57 PS; 324/51
[58] Field of Search ................. 102/206, 217, 218; 361/251; 324/57 R, 57 PS, 57 Q, 60 CD, 62, 51

[56] References Cited

U.S. PATENT DOCUMENTS

| 2,623,922 | 12/1952 | Muffly | 361/251 |
| 3,163,818 | 12/1964 | Spaven | 324/57 Q |
| 4,422,378 | 12/1983 | Plichta | 102/206 |
| 4,422,379 | 12/1983 | Geller et al. | 102/206 |

FOREIGN PATENT DOCUMENTS

| 2022222 | 12/1978 | United Kingdom. | |
| 2094487 | 9/1982 | United Kingdom | 102/206 |

OTHER PUBLICATIONS

Milman & Taub; "Pulse and Digital Circuits"-McGraw Hill, 1956—Chapter 2, pp. 48–56.

Primary Examiner—Stanley T. Krawczewicz
Assistant Examiner—Jose M. Solis
Attorney, Agent, or Firm—Cushman, Darby & Cushman

[57] ABSTRACT

An apparatus for and a method of testing AC operable detonating modules (10) whereby an electric charge is discharged through a primary wire (20) threaded through or around a transformer core (14) of a module being tested and the voltage across, or the current through the primary wire is determined. Modules can be simply and reliably tested by means of a compact apparatus requiring a current of only about 1.4 mA.

31 Claims, 1 Drawing Figure

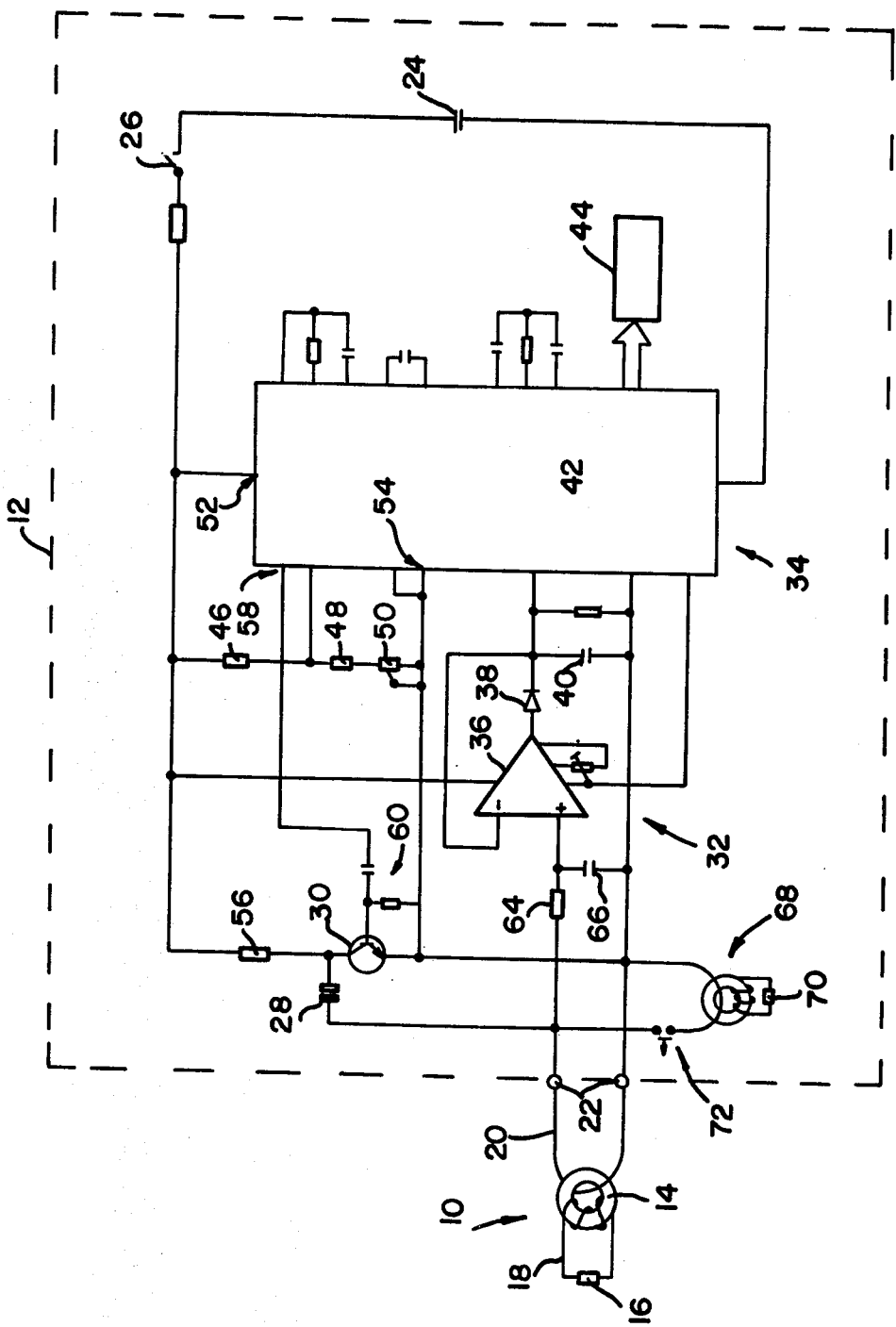

APPARATUS FOR AND A METHOD OF TESTING DETONATING SYSTEMS

This invention relates to an apparatus for and a method of testing detonating modules.

It relates in particular to detonating modules which utilise an AC detonating signal. Such modules have detonators coupled to a transformer device.

In a particular system, which is known as the "Magnadet" system, the detonators are coupled to toroid transformers which have ferrite cores. In use, the toroids are connected with a shot exploder via a single primary wire. The detonators are coupled thereto by leading wires which are wound a few turns (typically three turns) about the toroids. Thus, the detonators and their leading wires form secondary circuits, the primary circuit being formed by the AC exploder (which generates the firing current) and its associated supply wire.

Those skilled in the art will be aware that such AC modules, comprising a ferrite ring coupled to a detonator by a leading wire wound a few times round the ring also have to be tested. It is not possible to test the leading wires and detonators for continuity by DC means.

One way in which to test the modules would be to provide a primary circuit by threading a wire through the ferrite ring and ascertaining the resistive input impedance of the primary circuit by supplying a constant AC current of a suitable frequency to the input of the primary circuit. The voltage across the primary circuit would then be proportional to the resistance R of the secondary circuit formed by the detonator and leading wire and could be calculated as $$R = V/I \times n^2$$

where

V is the voltage across the primary winding

I is the current supplied to the primary winding and n is the ratio of secondary to primary number of turns.

With such a testing procedure, the current I injected into the primary circuit must be of a relatively high magnitude, to ensure sufficient amplitude of primary voltage V which in turn is necessary to achieve satisfactory accuracy with conventional instruments. For example, if the ratio of primary voltage to secondary circuit resistance of 10 millivolt per ohm is required, the primary current for a three turn toroid must be I=90 mA.

A portable instrument employing the above procedure would therefore require considerable battery current and would not be suitable for field use.

It is an object of the present invention to supply an apparatus and method for testing such AC operable detonating modules with a battery current drain of less than 2 mA. The apparatus to provide this should also be fairly small and compact for ease of use.

In accordance with the invention, there is provided a testing apparatus for testing AC operable detonating modules, which includes a charge storage means for storing a pre-determined amount of electric charge;

an output connecting means to which a primary wire which is threaded through or around a transformer core of a module to be tested may be connected;

a first switch means for connecting the charge storage means to the output connecting means; and a voltage or current determining means for determining the voltage across or the current through the output connecting means.

Further according to the invention there is provided a method of testing an AC operable detonating module, which includes storing a pre-determined quantity of electric charge;

discharging the charge through a primary wire threaded through or around a transformer core of a module being tested; and determining the voltage across or the current through the primary wire.

It will be appreciated that the detonating modules that are to be tested are inductive in nature having an inductance and resistance within a predetermined range. The charge storage means may then have a suitable capacitance that the total system formed by the charge storage means, the primary wire and individual detonating modules in the range is overdamped (or aperiodic). This will occur if the capacitance of the supply means C is such that $$C < n^4 \times L \div 4R^2$$

where n is as before, L is the minimum input inductance of the detonating modules and R is the maximum resistance of the secondary circuits of the detonating modules formed by the detonators and their leading wires.

In typical cases, R has a value of 0–5 ohms and the input inductance of the detonating module is about 3 $\mu$H. Thus, $$C < 2,4 \ \mu F.$$

The charge storage means may conveniently be a suitable capacitor.

Further the voltage across the output connection means which constitutes the input of the primary wire is preferably determined. With an overdamped system the transient voltage across the input of the system consists of two super-imposed exponential curves, having opposite polarities and different time constants. It can further be shown with an overdamped system that the peak voltage Vp of the transient input response is directly proportional to the resistance R connected to the core secondary side.

Thus, the apparatus may include a peak voltage detector and measuring means to determine the peak positive transient voltage across the output connecting means.

In a preferred form the first switch means may be a solid state switch such as a transistor or the like.

In order to ensure that the pre-determined quantity of charge is discharged into the primary wire the capacitor may be charged to a pre-determined voltage. Thus, the apparatus may include a stabilised voltage supply.

In a preferred form the testing procedure may be done a number of times with the capacitor being charged and discharged repetitively.

In order to check that the test apparatus is working correctly, it may include a check module having a known resistance with the output connecting means being connectable to the check module. This may be done by a suitable mechanical switch.

The output connecting means may be a pair of terminals.

The apparatus may also include a display means for displaying either the peak voltage or the equivalent resistance.

The invention is now described, by way of an example, with reference to the accompanying circuit diagram which shows a tester in accordance with the invention connected to a module that is to be tested.

Referring to the drawing, a detonating module that is to be tested is indicated generally by reference numeral 10 and the tester is designated generally by reference numeral 12.

The detonating module 10 comprises a ferrite ring 14, a detonator 16 with the detonator 16 being coupled with the ferrite ring 14 by means of a leading wire 18 that is wound three times around the ring 14.

The module 14 is connected to the tester 12 by means of a connecting wire 20 which is passed through the ring 14 and has its ends secured to output terminals 22. The connecting wire 20 constitutes a primary circuit with the detonator 16 and leading wire 18 forming a secondary circuit.

The tester 12 has a 9 volt battery 24 which supplies power via an on/off switch 26. The tester further has a testing capacitor 28 which is connected with the output terminals 22 via a transistor switch 30. The peak voltage across the output terminals 22 is monitored by a peak voltage monitor 32 and measured by a digital voltmeter 34. The peak voltage monitor 32 comprises an operational amplifier 36 with a diode 38 and storage capacitor 40 network. The capacitor 28 has a capacitance of 2.2 microfarad.

The digital voltmeter is basically an IC chip 42 which supplies a suitable output signal to a liquid crystal display 44. The voltmeter 34 is calibrated via resistors 46, 48 and potentiometer 50 such that its output signal indicates directly the resistance R of the detonator 16 and leading wire 18 with a resolution of 0.1 ohms.

Further, the chip 42 supplies a stabilised voltage of about 2.8 volts between its pins 1 and 32 which are referenced with numerals 52 and 54 respectively. This stabilised signal is supplied to the testing capacitor 28 to charge it with a predetermined charge. It will be noted that the capacitor 28 is charged via a resistor 56 and the connecting wire 20.

The chip 42 also supplies a square wave signal, having a repetition period of about 30 milli-seconds, at pin 21 (reference numeral 58). This signal is differentiated by a capacitor and resistance network 60 to cyclically switch the transistor 30 on. It will be noted that when the transistor 30 is switched on, the capacitor 28 discharges through the connecting wire 20. As indicated earlier, this discharge generates a peak transient voltage Vp across the output terminals 22 which is proprtional to the resistance R of the detonator 16 and its leading wire 18. The peak voltage Vp is stored across the storage capacitor 40, measured by the digital voltmeter 34 and indicated on the liquid crystal display 44.

The applicant has found that when the resistance R of the detonator 16 and leading wire 18 approaches zero, as in the case of a shorted detonator bridge wire and short detonator leading wires, the peak voltage Vp does not approach zero, but a positive short duration (less than two micro-second) peak of about 45 mV appears across the terminals 22. In order to remove this false signal an integrating network comprising resistance 64 and capacitor 66 is connected between the output terminals 22 and the input to the peak voltage monitor 32. This integrating network then filters out the spurious spike and the liquid crystal display gives the correct output with 0 resistance.

In order to ensure that the tester 12 is operating correctly, it also has a check module 68 with a resistor 70 having a resistance of 2 ohm connected across the output terminals 22 via a press button switch 72. With nothing connected to the output terminals 22, the switch 72 is closed and the liquid crystal display 44 is checked to be 2.0.

It will be appreciated that there is a relationship between the peak voltage and the peak current. Thus instead of monitoring the voltage the current could be monitored by any suitable means well known in the art. For example, a suitably small resistor could be used in series with the output terminals, the voltage across it being monitored. Alternatively a transformer arrangement could be used.

With the tester in accordance with the invention, a simple, compact and reliable means is provided for testing AC detonator modules. Further, with the tester in accordance with the invention the average current consumption from the battery 24 is about 1.4 mA. Thus, if a standard PM3 battery is used, its life will be over 200 hours, and in the case of an alkaline battery, about 350 hours.

I claim:

1. Apparatus for impulse testing of a first reactive element having a resistive component R to be measured, said apparatus comprising:
   a second reactive element means for storing a calibrated energy value from a power supply;
   switch means for releasing said calibrated energy from said second reactive element means into said first reactive element so as to obtain an overdamped or non-oscillatory response of the second order; and
   measurement means for effecting a single reading of a single peak value of said second order response and for extracting the value of said resistive component R from said calibrated energy value and from said single reading of a peak value of said second order response.

2. Apparatus as in claim 1 wherein:
   said first reactive element includes a transformer core having an N turn ratio of secondary-to-primary turns and having a minimum expected inductance L and a maximum expected resistance R;
   said second reactive element includes capacitance C; and
   said capacitance C is less than $(N^4L)/(4R^2)$.

3. Apparatus as in claim 1 further comprising:
   a test standard first reactive element; and
   a test switch connected to said second reactive element and to said test standard firs reactive element.

4. Apparatus as in claim 1 wherein said measurement means includes an integrator circuit at its input for damping spurious transients thereat.

5. An apparatus for testing AC operable detonating modules, which includes
   a charge storage means for storing a pre-determined amount of electric charge and for establishing an overdamped RLC circuit when connected to one of said detonating modules;
   an output connecting means to which a primary wire to which is treaded through or around a transformer core of a module to be tested may be connected;

a first switch means for connecting the charge storage means to the output connecting means; and a voltage determining means for determining the voltage across the output connecting means.

6. A testing apparatus as claimed in claim 5 which is designed for use with detonating modules having an inductance and resistance within a predetermined range and the charge storage means has a suitable capacitance to provide, in use, an overdamped system.

7. A testing apparatus as claimed in claim 6, in which the charge storage means has a capacitance C that is less than $$(N^4 \cdot L)/(4 \cdot R^2)$$

where

N is the number of turns that leading wires for detonators of the detonating modules are wound around the transformer cores of the detonating modules with which the apparatus is to be used;

L is the minimum input inductance of the detonating modules; and

R is the maximum resistance of the secondary circuits of the detonating modules formed by the detonators and their leading wires.

8. A testing apparatus as claimed in claim 5, in which the voltage determining means is a peak voltage determining means.

9. A testing apparatus as claimed in claim 5 which includes a stablised voltage supply means for charging the charge storage means.

10. A testing apparatus as claimed in claim 5 which includes a check detonating module having a known constant resistance; and a second switch means for connecting the output connecting means to the check detonating module.

11. A testing apparatus as claimed in claim 5, which includes a display means for displaying the voltage determined by the voltage determining means.

12. An apparatus for testing AC operable detonating modules, which includes a charge storage means for storing a pre-determined amount of electric charge and for establishing an overdamped RLC circuit when connected to one of said detonating modules;

an output connecting means to which a primary wire which is threaded through or around a transformer core of a module to be tested may be connected;

a first switch means for connecting the charge storage means to the output connecting means; and an electric signal determining means for determining the magnitude of an electrical signal through the output connecting means.

13. A testing apparatus as claimed in claim 12, which is designed for use with detonating modules having an inductance and resistance within a predetermined range and the charge storage means has a suitable capacitance to provide, in use, an overdamped system.

14. A testing apparatus as claimed in claim 13, in which the charge storage means has a capacitance C that is less than $$(N^4 \cdot L)/(4 \cdot R^2)$$

where

N is the number of turns that leading wires for detonators of the detonating modules are wound around the tranformer cores of the detonating modules with which the apparatus is to be used;

L is the minimum input inductance of the detonating modules; and

R is the maximum resistance of the secondary circuits of the detonating modules formed by the detonators and their leading wires.

15. A testing apparatus as claimed in claim 12 which includes a stablised voltage supply means for charging the charge storage means.

16. A testing apparatus as claimed in claim 12 which includes a check detonating module having a known constant resistance; and a second switch means for connecting the output connecting means to the check detonating module.

17. A method of testing an AC operable detonating module, which includes storing a pre-determined quantity of electric charge;

discharging the charge through or around a primary wire threaded through an overdamped RLC circuit including a transformer core of a module being tested; and determining the voltage across the primary wire.

18. A method as claimed in claim 17, in which the charge is discharged from a storage means thereof having a suitable capacitance to provide an overdamped system.

19. A method as claimed in claim 17, which includes detecting the peak transient voltage.

20. A method as claimed in claim 17, which includes storing the charge, discharging it and determining the voltage a number of times.

21. A method of testing an AC operable detonating module, which includes storing a pre-determined quantity of electric charge;

discharging the charge through a primary wire threaded through an overdampled RLC circuit including a transformer core of a module being tested; and determining the magnitude of an electrical signal at the primary wire.

22. A method as claimed in claim 21, in which the charge is discharged from a storage means thereof having a suitable capacitance to provide an overdamped system.

23. A method as claimed in claim 21, which includes storing the charge, discharging it and determining the current a number of times.

24. Apparatus for measuring the resistance R associated with an inductance L in a secondary electrical circuit inductively coupled to a transformer core, by measuring the peak electrical signal developed in a primary electrical circuit also inductively coupled to said transformer core, said apparatus comprising:

a source of dc power;

a capacitor connected for charging by source and having a capacitance C which establishes an overdamped RLC circuit;

a switch connected to said capacitor for controllably connecting said capacitor to discharge through said primary circuit; and a peak electrical signal meter connected to said capacitor for measuring the peak value of an electrical signal developed in said primary circuit during the discharge of said capacitor and for indicating the measured peak value as a measured of said resistance R.

25. Apparatus as in claim 24 wherein said capacitor has a capacitance less than $(N^4L)/(4R^2)$ to insure an overdamped RLC circuit were N is the ratio of secondary to primary turns coupled to said transformer core, L is the minimum expected inductance and R is the maximum expected resistance in the secondary circuit for a given class of circuits to be tested.

26. Apparatus as in claim 24 further comprising:
a test standard transformer core inductively coupled to a test standard secondary circuit having a known test standard resistance therein; and
a test switch connected to said capacitor and to a test standard primary circuit which is inductively coupled to said test standard transformer core.

27. Apparatus as in claim 25 wherein:
a test standard transformer core inductively coupled to a test standard secondary circuit having a known test standard resistance therein; and
a test switch connected to said capacitor and to a test standard primary circuit which is inductively coupled to said test standard transformer core.

28. Apparatus as in claim 24 wherein said peak electrical signal meter includes an integrator circuit as its input for damping spurious transients thereat.

29. Apparatus as in claim 25 wherein said peak electrical signal meter includes an integrator circuit at its input for damping spurious transients thereat.

30. Apparatus as in claim 26 wherein said peak electrical signal meter includes an integrator circuit at its input for damping spurious transients thereat.

31. Apparatus as in claim 27 wherein said peak electrical signal meter includes an integrator circuit at its input for damping spurious transients thereat.

* * * * *